United States Patent
Xu et al.

(10) Patent No.: US 12,532,525 B2
(45) Date of Patent: Jan. 20, 2026

(54) METHOD FOR MANUFACTURING GATE OF NAND FLASH

(71) Applicant: Shanghai Huali Microelectronics Corporation, Shanghai (CN)

(72) Inventors: Pengkai Xu, Shanghai (CN); Fulong Qiao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 447 days.

(21) Appl. No.: 18/152,870

(22) Filed: Jan. 11, 2023

(65) Prior Publication Data
US 2023/0170392 A1 Jun. 1, 2023

(30) Foreign Application Priority Data
May 24, 2022 (CN) .......................... 202210570918.4

(51) Int. Cl.
| | |
|---|---|
| H01L 21/28 | (2025.01) |
| H01L 21/3215 | (2006.01) |
| H01L 21/762 | (2006.01) |
| H10B 41/35 | (2023.01) |
| H10D 64/01 | (2025.01) |

(52) U.S. Cl.
CPC ..... *H10D 64/035* (2025.01); *H01L 21/32155* (2013.01); *H01L 21/76224* (2013.01); *H10B 41/35* (2023.02)

(58) Field of Classification Search
CPC ............. H10D 30/0411; H10D 64/035; H10D 30/6892; H10D 30/681; H10B 41/30; H10B 41/35; H01L 21/32155; H01L 21/26513; H01L 21/32139
See application file for complete search history.

(56) References Cited

U.S. PATENT DOCUMENTS

2022/0093619 A1* 3/2022 Tsai .................... H10D 64/035

* cited by examiner

*Primary Examiner* — John A Bodnar
(74) *Attorney, Agent, or Firm* — Quarles & Brady LLP

(57) ABSTRACT

The present application discloses a method for manufacturing a NAND flash, comprising: step 1, sequentially form a floating gate dielectric layer and a first polysilicon layer; step 2, sequentially forming an inter-gate dielectric layer and a second polysilicon layer, wherein a first doping concentration of the second polysilicon layer is less than a target doping concentration; step 3, forming a pattern transfer mask layer; step 4, patterning the pattern transfer mask layer; step 5, performing gate etching, wherein the first and second polysilicon layers subjected to the gate etching respectively form a polysilicon floating gate and the polysilicon control gate; step 6, forming a first spacer, wherein the first spacer in a storage area fully fills a first interval area; and step 7, performing self-aligned ion implantation to increase a doping concentration of the polysilicon control gate to the target doping concentration.

15 Claims, 14 Drawing Sheets

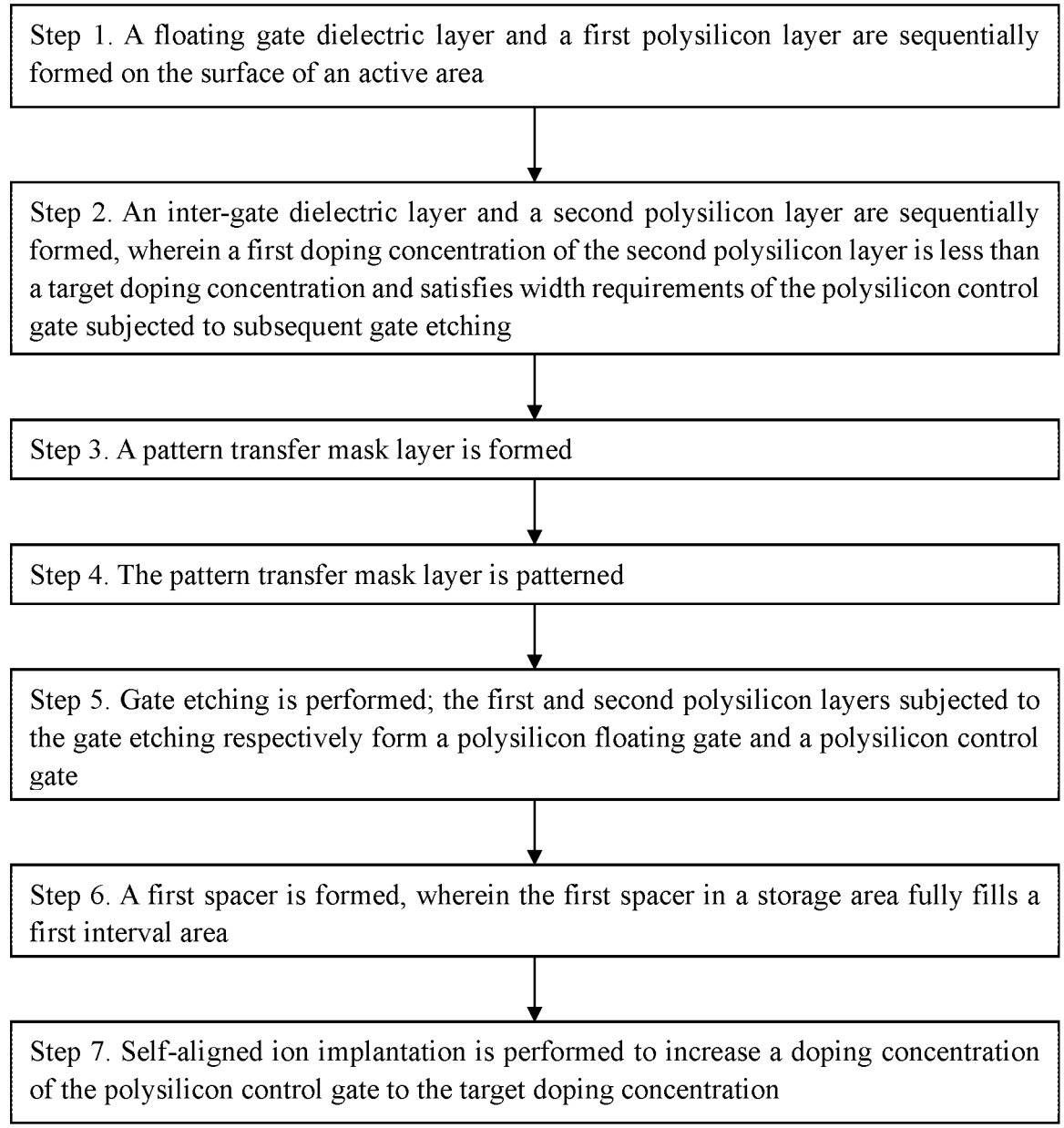

Step 1. A floating gate dielectric layer and a first polysilicon layer are sequentially formed on the surface of an active area Step 2. An inter-gate dielectric layer and a second polysilicon layer are sequentially formed, wherein a first doping concentration of the second polysilicon layer is less than a target doping concentration and satisfies width requirements of the polysilicon control gate subjected to subsequent gate etching Step 3. A pattern transfer mask layer is formed Step 4. The pattern transfer mask layer is patterned Step 5. Gate etching is performed; the first and second polysilicon layers subjected to the gate etching respectively form a polysilicon floating gate and a polysilicon control gate Step 6. A first spacer is formed, wherein the first spacer in a storage area fully fills a first interval area Step 7. Self-aligned ion implantation is performed to increase a doping concentration of the polysilicon control gate to the target doping concentration

FIG. 7

METHOD FOR MANUFACTURING GATE OF NAND FLASH

CROSS-REFERENCES TO RELATED APPLICATIONS

This application claims the priority to Chinese patent application No. CN 202210570918.4, filed on May 24, 2022, and entitled "METHOD FOR MANUFACTURING GATE OF NAND FLASH", the disclosure of which is incorporated herein by reference in entirety.

TECHNICAL FIELD

The present application relates to a semiconductor integrated circuit, in particular to a method for manufacturing a gate of a NAND flash.

BACKGROUND

The NAND flash attracts extensive attention due to its advantages such as a size that can be reduced as much as possible and a relatively large capacity. The gate etching process in the manufacturing process becomes the "crown in NAND flash manufacturing" due to challenges therein such as an extremely complex etching film structure and a high aspect ratio.

A gate structure of a memory cell of the NAND flash is a stacked structure, and a film structure of the gate structure of the memory cell includes a polysilicon floating gate, an inter-gate dielectric layer, and a polysilicon control gate arranged in sequence from bottom to top. Regarding a structure on the surface of a field oxide such as shallow trench isolation (STI), due to the characteristics of the process, a film structure thereof includes the inter-gate dielectric layer and the polysilicon control gate arranged in sequence from bottom to top. It thus can be seen that the inter-gate dielectric layer is wrapped around the polysilicon floating gate to isolate the polysilicon control gate from the polysilicon floating gate. In order to reduce the thickness of a polysilicon depletion layer and increase the erasing and writing speeds, the formation process of the polysilicon control gate adopts an in-situ doping solution, i.e., doping with phosphorus and carbon elements. Regarding the polysilicon depletion layer, after a gate voltage is applied to the polysilicon control gate via a gate metal electrode, electrons in the polysilicon control gate are easily attracted to one side of the gate metal electrode; in this case, carrier depletion occurs in the polysilicon control gate of a part of the thickness thereof that is close to the inter-gate dielectric layer, and the polysilicon depletion layer is formed. The polysilicon depletion layer is equivalent to an additional thickness of the inter-gate dielectric layer, which reduces the coupling capacitance between the polysilicon control gate and the polysilicon floating gate, thereby reducing the erasing and writing speeds.

In order to ensure that the gate structure can be safely formed, it is necessary to form different mask layer structures above the gate structure. In particular, for the node below 20 nm, it is necessary to adopt the self-aligned double patterning (SADP) technology, which is a process that uses an etched spacer as a film that defines the critical dimension (CD). After passing through a pattern transfer layer, the critical dimension of the spacer is transferred to a gate below the same.

FIG. 1 is a plan view of a portion of a storage area in an existing method for manufacturing a gate of a NAND flash. FIGS. 2A-6A are sectional views along the dashed line AA in FIG. 1 in the steps of the existing method for manufacturing a gate of a NAND flash. FIGS. 2B-6B are sectional views along the dashed line BB in FIG. 1 in the steps of the existing method for manufacturing a gate of a NAND flash. In the existing method for manufacturing a NAND flash, forming a memory cell of the storage area of the flash includes the following steps.

Step 1. Referring to FIG. 1, a plurality of field oxides 102 are formed on a semiconductor substrate 101, the field oxides 102 isolating a plurality of active areas. In FIG. 1, the semiconductor substrate 101 between the field oxides 102 forms the active area. A section at the dashed line AA is a section along the active area, and a section at the dashed line BB is a section between the subsequently formed polysilicon control gates 104. An overlap area of a polysilicon control gate 104 and the active area is a formation area of a polysilicon floating gate 103.

Referring to FIG. 2A, a floating gate dielectric layer 105 and a first polysilicon layer 103a are sequentially formed on the surface of the active area, and the first polysilicon layer 103a is used to form the polysilicon floating gate 103.

Referring to FIG. 2B, the floating gate dielectric layer 105 and the first polysilicon layer 103a are not formed on the surface of the field oxide 101. Referring to FIG. 1, the floating gate dielectric layer 105 and the first polysilicon layer 103a are generally formed on the surface of the active area in a self-aligned manner.

Generally, the semiconductor substrate 101 includes a silicon substrate.

The field oxide 102 is formed by means of a shallow trench isolation (STI) process.

In the storage area, all the field oxides 102 are arranged in parallel, and all the active areas are arranged in parallel.

Step 2. Referring to FIG. 2A, an inter-gate dielectric layer 106 and a second polysilicon layer 104a are sequentially formed. Referring to FIG. 2B, the inter-gate dielectric layer 106 covers the surface of the first polysilicon layer 103a and the surface of the field oxide 102; the second polysilicon layer 104a is formed on the surface of the inter-gate dielectric layer 106. The second polysilicon layer 104a is used to form the polysilicon control gate 104. The doping concentration of the second polysilicon layer 104a is necessarily configured to be a heavy doping concentration to satisfy the requirements of the device performance, including a threshold voltage and erasing and writing speeds of the memory cell that satisfy desired values. The threshold voltage and the erasing and writing speeds of the memory cell are both related to a coupling effect between the second polysilicon layer 104a and the polysilicon floating gate 103. When the doping concentration of the second polysilicon layer 104a is increased, the polysilicon resistance of the polysilicon control gate 104 can be reduced, and the thickness of a polysilicon depletion layer of the polysilicon control gate 104 can also be reduced, increasing the capacitance between the polysilicon control gate 104 and the polysilicon floating gate 103 and thereby enhancing the coupling effect, so that the erasing and writing speeds and the threshold voltage both satisfy the requirements.

Generally, a selection transistor is also formed in the storage area.

In an array of the memory cells, the selection transistor is connected in series with a plurality of the memory cells under control. After the inter-gate dielectric layer 106 is formed, the method further includes selectively etching the inter-gate dielectric layer 106 to remove the entire or part of the inter-gate dielectric layer 106 in a formation area of the selection transistor. After the second polysilicon layer 104a is formed, in the formation area of the selection transistor, the second polysilicon layer 104a is in contact with the bottom first polysilicon layer 103a.

A peripheral area (not shown) is provided outside the storage area, and a peripheral transistor is formed in the peripheral area. After the inter-gate dielectric layer 106 is formed, the method further includes selectively etching the inter-gate dielectric layer 106 to remove the entire or part of the inter-gate dielectric layer 106 in a formation area of the peripheral transistor. After the second polysilicon layer 104a is formed, in the formation area of the peripheral transistor, the second polysilicon layer 104a is in direct contact with the bottom first polysilicon layer 103a in an area where the inter-gate dielectric layer 6 is removed.

Step 3. Referring to FIG. 2A, a pattern transfer mask layer 107, which is composed of a plurality of mask sublayers with different etching rates, is formed on the surface of the second polysilicon layer 104a.

In FIG. 2A, the pattern transfer mask layer 107 is formed by stacking a first mask sublayer 1071, a second mask sublayer 1072, and a third mask sublayer 1073. The first mask sublayer 1071 is a silicon nitride layer, the second mask sublayer 1072 is a silicon oxide layer, and the third mask sublayer 1073 is made of amorphous silicon.

Step 4. Referring to FIG. 2A, a formation area of the polysilicon control gate 104 is defined. Since a formation area corresponding to FIG. 2B is an area between the polysilicon control gates 104, the area in FIG. 2B is fully open.

A second spacer 108 is usually formed by means of an SADP process to define the formation area of the polysilicon control gate 104 of each of the memory cells.

A photoresist pattern 109 is used to define the formation areas of the polysilicon control gates 104 of each of the selection transistors and each of the peripheral transistors.

Referring to FIG. 3A, the mask sublayers of the pattern transfer mask layer 107 outside the formation area of the polysilicon control gate 104 are sequentially etched to achieve patterning of the pattern transfer mask layer 107. During patterned etching of the pattern transfer mask layer 107, the third mask sublayer 1073 is first etched by using the second spacer 108 and the photoresist pattern 109 as masks, so as to pattern the third mask sublayer 1073; then the second mask sublayer 1072 is etched by using the second spacer 108, the photoresist pattern 109, and the third mask sublayer 1073 at the bottom as masks, so as to pattern the second mask sublayer 1072; and after that, the first mask sublayer 1071 is etched by using the second spacer 108, the photoresist pattern 109, and the third mask sublayer 1073 and the second mask sublayer 1072 at the bottom as masks, so as to pattern the first mask sublayer 1071. By transferring a pattern downwards layer by layer, the pattern can be transferred accurately. In this way, even if a loss of the second spacer 108 and the photoresist pattern 109 occurs during an etching process, a pattern of the first mask sublayer 1071 is not affected.

It can be seen from FIG. 3B that the pattern transfer mask layer 107 in FIG. 3B is fully removed.

Step 5. Gate etching is performed, including: sequentially etching the second polysilicon layer 104a, the inter-gate dielectric layer 106, and the first polysilicon layer 103a by using the patterned pattern transfer mask layer 107 as a mask.

That is, the gate etching includes three etching steps, which are respectively: etching of the second polysilicon layer 104a, etching of the inter-gate dielectric layer 106, and etching of the first polysilicon layer 103a.

Referring to FIG. 4A, the polysilicon control gate 104 is formed by etching the second polysilicon layer 104a. In FIG. 4A, the polysilicon control gate formed after the etching of the second polysilicon layer 104a is separately represented by a mark 104. In addition, in the formation area of the selection transistor, an etched portion of the second polysilicon layer 104a is separately represented by a mark 104b. The second polysilicon layer 104a in an area shown in FIG. 4B is fully removed. The etching of the second polysilicon layer 104a stops on the surface of the inter-gate dielectric layer 106.

Referring to FIG. 5A, the etching of the inter-gate dielectric layer 106 is then performed, and the etching of the inter-gate dielectric layer 106 stops in the first polysilicon layer 103a. Generally, during a process of etching the inter-gate dielectric layer 106, the side surface of the polysilicon control gate 104 is exposed and laterally etched to reduce the width of the polysilicon control gate 104. In FIG. 5A, the dashed line box 110 represents the formation area of the polysilicon control gate 104 in a case before the etching of the inter-gate dielectric layer 106. It can be seen that the width of the polysilicon control gate 104 is reduced.

Referring to FIG. 6A, the etching of the first polysilicon layer 103a is then performed, and the etching of the first polysilicon layer 103a stops on the surface of the floating gate dielectric layer 105. Generally, during a process of etching the first polysilicon layer 103a, the side surface of the polysilicon control gate 104 is exposed and laterally etched to further reduce the width of the polysilicon control gate 104. The first polysilicon layer 103a in an area shown in FIG. 6B is fully removed. In FIG. 6A, the polysilicon floating gate of the memory cell formed after the etching of the first polysilicon layer 103a is separately represented by a mark 103, and polysilicon of the selection transistor formed after the etching of the first polysilicon layer 103a is separately represented by a mark 103b.

The polysilicon control gate 104 is composed of the second polysilicon layer 104a subjected to the gate etching. The polysilicon floating gate 103 is composed of the first polysilicon layer 103a subjected to the gate etching. Each of the memory cells has a first gate structure, and the first gate structure is formed by stacking the floating gate dielectric layer 105 formed on the surface of the active area, the polysilicon floating gate 103, the inter-gate dielectric layer 106, and the polysilicon control gate 104. A first interval area is provided between the first gate structures.

Generally, referring to FIG. 1, all the memory cells are arranged in an array, the polysilicon control gates 104 of the memory cells in the same row are connected together to form a polysilicon row, each of the polysilicon rows spans a plurality of the active areas and a plurality of the field oxides 102, and all the polysilicon rows are arranged in parallel.

After the etching in step 5 is completed, a second gate structure 111 of the selection transistor is also formed in the formation area of the selection transistor. The second gate structure 111 is formed by stacking the gate dielectric layer formed on the surface of the active area, the first polysilicon layer 103b, and the second polysilicon layer 104b. The gate dielectric layer of the second gate structure 111 has a process structure the same as that of the floating gate dielectric layer 105.

A third gate structure (not shown) of the peripheral transistor is also formed in the formation area of the peripheral transistor. The third gate structure is formed by stacking the gate dielectric layer formed on the surface of the active area, the first polysilicon layer, and the second poly silicon layer.

As can be seen from the above, during the gate etching process of the existing method, in the steps of etching the inter-gate dielectric layer and etching the polysilicon floating gate, the polysilicon control gate is prone to lateral etching, which leads to a reduction in the critical dimension thereof. The dimension reduction of the polysilicon control gate becomes more significant after phosphorus doping of the polysilicon.

As the critical dimension of the gate structure decreases, the impact of the reduction in the critical dimension becomes increasingly more serious, not only causing a collapse of the gate structure which affects the product yield, but also reducing the couple ratio between the polysilicon control gate and the polysilicon floating gate of the gate structure, thus affecting critical parameters such as a programming speed. Reducing etching amounts of the inter-gate dielectric layer and the polysilicon floating gate may facilitate the solving of the above problems, but causes problems such as a fence defect and a polysilicon residue. Reducing the phosphorus doping of the polysilicon control gate may facilitate the solving of the above problems, but is detrimental to critical device parameters such as the programming speed. This is because, although eliminating the technical problem of a reduction in the critical dimension of the gate structure, the phosphorus doping of the polysilicon control gate may lead to a problem of an increase in the thickness of the depletion layer of the polysilicon control gate. The increase in the thickness of the depletion layer of the polysilicon control gate leads to an increase in the thickness of the inter-gate dielectric layer, which causes a reduction in the coupling capacitance between the polysilicon control gate and the polysilicon floating gate. Thus, the couple ratio between the polysilicon control gate and the polysilicon floating gate is also reduced. Therefore, in the existing method, although an increase in the phosphorus doping concentration of the polysilicon control gate may reduce the thickness of the polysilicon depletion layer, it imposes an adverse impact on the gate etching process, i.e., a reduction in the critical dimension of the polysilicon control gate which leads to a reduction in the couple ratio between the polysilicon control gate and the polysilicon floating gate of the gate structure. If the phosphorus doping concentration of the polysilicon control gate is reduced, although the critical dimension of the polysilicon control gate can be maintained, the thickness of the polysilicon depletion layer is increased. An increase in the thickness of the polysilicon depletion layer also leads to a reduction in the couple ratio between the polysilicon control gate and the polysilicon floating gate of the gate structure, eventually reducing the erasing and writing speeds of the device. Therefore, in the existing method, a gate etching process window and the performance of the product device have opposite requirements on the doping concentration of the polysilicon control gate, that is, there is a contradiction therebetween.

BRIEF SUMMARY

The technical problem to be solved by the present application is to provide a method for manufacturing a NAND flash, which can increase the gate etching process window of the memory cell and ensure that the product device performance also meets the requirements.

According to some embodiments in this application, in the method for manufacturing a NAND flash provided by the present application, forming a memory cell of a storage area of the flash includes the following steps:

step 1, forming a plurality of field oxides on a semiconductor substrate, the field oxides isolating a plurality of active areas, and sequentially form a floating gate dielectric layer and a first polysilicon layer on the surface of an active area, the first polysilicon layer being used to form a polysilicon floating gate;

step 2, sequentially forming an inter-gate dielectric layer and a second polysilicon layer, the inter-gate dielectric layer covering the surface of the first polysilicon layer and the surface of the field oxide, the second polysilicon layer being formed on the surface of the inter-gate dielectric layer, the second polysilicon layer being used to form a polysilicon control gate, the second polysilicon layer having a first doping concentration, the polysilicon control gate having a target doping concentration, the first doping concentration being less than the target doping concentration, and the first doping concentration being configured such that the width of the polysilicon control gate satisfies requirements after subsequent gate etching;

step 3, forming a pattern transfer mask layer composed of a plurality of mask sublayers with different etching rates on the surface of the second polysilicon layer;

step 4, defining a formation area of the polysilicon control gate, and sequentially etching the mask sublayers of the pattern transfer mask layer outside the formation area of the polysilicon control gate to achieve patterning of the pattern transfer mask layer;

step 5, performing gate etching, including: sequentially etching the second polysilicon layer, the inter-gate dielectric layer, and the first polysilicon layer by using the patterned pattern transfer mask layer as a mask, wherein the polysilicon control gate is composed of the second polysilicon layer subjected to the gate etching, the polysilicon floating gate is composed of the first polysilicon layer subjected to the gate etching, each of the memory cells has a first gate structure, the first gate structure is formed by stacking the floating gate dielectric layer formed on the surface of the active area, the polysilicon floating gate, the inter-gate dielectric layer, and the polysilicon control gate, and a first interval area is provided between the first gate structures;

during processes of etching the inter-gate dielectric layer and the first polysilicon layer, the side surface of the polysilicon control gate is exposed and laterally etched to reduce the width of the polysilicon control gate, width control on the polysilicon control gate after the gate etching is achieved due to a feature that a reduction in the width of the polysilicon control gate is smaller when the first doping concentration is lower, and the width of the polysilicon control gate subjected to the gate etching is required to ensure that the polysilicon control gate does not collapse and an overlap area between the polysilicon control gate and the polysilicon floating gate is increased;

step 6, forming a first spacer, wherein in the storage area, the first spacer is formed on the side surface of the first gate structure and fully fills the first interval area; and step 7, adjusting the thickness of the pattern transfer mask layer on the top of the polysilicon control gate by using the first spacer as a self-aligned mask, and then performing self-aligned ion implantation, wherein due to the self-aligned ion implantation, a dopant is implanted into the polysilicon control gate after passing through the pattern transfer mask layer, and the self-aligned ion implantation increases a doping concentration of the polysilicon control gate to the target doping concentration.

In some cases, the semiconductor substrate includes a silicon substrate.

In some cases, the field oxide is formed by means of a shallow trench isolation process.

In some cases, in step 1, in the storage area, all the field oxides are arranged in parallel, and all the active areas are arranged in parallel.

In some cases, in step 5, all the memory cells are arranged in an array, the polysilicon control gates of the memory cells in the same row are connected together to form a polysilicon row, each of the polysilicon rows spans a plurality of the active areas and a plurality of the field oxides, and all the polysilicon rows are arranged in parallel.

In some cases, a selection transistor is also formed in the storage area.

In an array of the memory cells, the selection transistor is connected in series with a plurality of the memory cells under control.

After the inter-gate dielectric layer is formed in step 2, the method further includes selectively etching the inter-gate dielectric layer to remove the entire or part of the inter-gate dielectric layer in a formation area of the selection transistor; after the second polysilicon layer is formed, in the formation area of the selection transistor, the second polysilicon layer is in contact with the bottom first polysilicon layer.

After the etching in step 5 is completed, a second gate structure of the selection transistor is also formed in the formation area of the selection transistor, and the second gate structure is formed by stacking the gate dielectric layer formed on the surface of the active area, the first poly silicon layer, and the second poly silicon layer.

In some cases, a peripheral area is provided outside the storage area, and a peripheral transistor is formed in the peripheral area.

After the inter-gate dielectric layer is formed in step 2, the method further includes selectively etching the inter-gate dielectric layer to remove the entire or part of the inter-gate dielectric layer in a formation area of the peripheral transistor; after the second polysilicon layer is formed, in the formation area of the peripheral transistor, the second polysilicon layer is in contact with the bottom first polysilicon layer.

After the etching in step 5 is completed, a third gate structure of the peripheral transistor is also formed in the formation area of the peripheral transistor, and the third gate structure is formed by stacking the gate dielectric layer formed on the surface of the active area, the first poly silicon layer, and the second poly silicon layer.

In some cases, in step 3, the pattern transfer mask layer is formed by stacking a first mask sublayer, a second mask sublayer, and a third mask sublayer, the first mask sublayer is a silicon nitride layer, the second mask sublayer is a silicon oxide layer, and the third mask sublayer is made of amorphous silicon.

In some cases, in step 4, a second spacer is formed by means of an SADP process to define the formation area of the polysilicon control gate of each of the memory cells.

A photoresist pattern is used to define the formation areas of the polysilicon control gates of each of the selection transistors and each of the peripheral transistors.

In some cases, in step 6, the first spacer is also formed on the side surface of the second gate structure and the side surface of the third gate structure, in a second interval area between the second gate structures, and in a third interval area between the third gate structures.

In some cases, before step 7, the method further includes:
  forming a second mask layer, the second mask layer being formed on the top surfaces of the first gate structure, the second gate structure, and the third gate structure and on the surface of the active area in the second interval area and the third interval area; and
  etching the second mask layer to remove the second mask layer on the top surfaces of the first gate structure, the second gate structure, and the third gate structure, wherein the second interval area and the third interval area are filled with the first spacer and the second mask layer.

In some cases, the second mask layer is an air gap mask layer, and after step 7 is completed, the method further includes:
  removing the entire or part of the first spacer by using the second mask layer as a mask; and
  closing the top of an area where the first spacer is removed, so as to form an air gap.

In some cases, the first spacer is formed by stacking a first sub-spacer and a second sub-spacer, the material of the first sub-spacer is silicon oxide, and the material of the second sub-spacer is silicon nitride.

In some cases, the second mask layer is formed by stacking a silicon oxide layer, a silicon nitride layer, and a silicon oxide layer.

In some cases, the target doping concentration is configured such that a threshold voltage and erasing and writing speeds of the memory cell satisfy desired values.

In the present application, the first doping concentration of the second polysilicon layer used to form the polysilicon control gate by means of etching is configured to be less than the target doping concentration of the polysilicon gate. In this case, the first doping concentration can be configured independently of the target doping concentration, so that the first doping concentration can be configured according to the gate etching process requirements of the memory cell. Due to the feature that the reduction in the width of the polysilicon control gate is smaller when the first doping concentration is lower in the processes of etching the inter-gate dielectric layer and the first polysilicon layer, the reduction in the width of the polysilicon control gate in the etching process is reduced by reducing the first doping concentration, thereby increasing the width of the etched polysilicon control gate, so that the width of the etched polysilicon control gate satisfies the requirements. The width of the etched polysilicon control gate is required to ensure that the polysilicon control gate does not collapse and to satisfy electrical requirements. On the basis that the polysilicon gate does not collapse, after the width of the etched polysilicon control gate is increased, the overlap area between the polysilicon control gate and the polysilicon floating gate is also increased, thereby improving the coupling between the polysilicon control gate and the polysilicon floating gate. Therefore, the present application eventually can increase the gate etching process window and device window of the memory cell.

Moreover, in the present application, after the etching process of the first gate structure is completed, by filling the first interval area between the first gate structures with the first spacer, the self-aligned ion implantation on the polysilicon control gate can be realized, the doping concentration of the polysilicon control gate is increased to the target doping concentration by means of the self-aligned ion implantation, and the self-aligned ion implantation can reduce the process cost. The target doping concentration can enable the performance of the memory cell such as the threshold voltage and erasing and writing speeds to satisfy the requirements. When the target doping concentration is higher, the thickness of the polysilicon depletion layer of the polysilicon control gate is smaller, the polysilicon resistance of the polysilicon control gate is smaller, the capacitance between the polysilicon control gate and the polysilicon floating gate is larger, and the coupling effect is stronger, thereby increasing the erasing and writing speeds. In this way, the erasing and writing speeds can satisfy the requirements, and the threshold voltage can also satisfy the requirements.

As can be seen from the above, in the present application, the doping concentrations of the second polysilicon layer subjected and not subjected to the etching are configured according to different requirements, respectively, so as to solve the defect that the etching process window for the first gate structure and the performance of the product device have contradictory requirements for the doping concentration of the second polysilicon layer, so that the etching process window for the first gate structure and the performance of the eventually formed product device can both satisfy the requirements, respectively.

In addition, the self-aligned ion implantation of the present application does not require an additional mask, so the present application also has a feature of a low process cost.

BRIEF DESCRIPTION OF THE DRAWINGS

The present application is described in detail below with reference to the drawings and specific implementations:

FIGS. 2A-6A are sectional views along the dashed line AA in FIG. 1 in the steps of the existing method for manufacturing a gate of a NAND flash.

FIGS. 2B-6B are sectional views along the dashed line BB in FIG. 1 in the steps of the existing method for manufacturing a gate of a NAND flash.

FIG. 7 is a flowchart of a method for manufacturing a gate of a NAND flash according to an embodiment of the present application.

FIGS. 9A-17A are sectional views along the dashed line AA in FIG. 8 in the steps of the method for manufacturing a gate of a NAND flash according to an embodiment of the present application.

FIGS. 9B-17B are sectional views along the dashed line BB in FIG. 8 in the steps of the method for manufacturing a gate of a NAND flash according to an embodiment of the present application.

DETAILED DESCRIPTION OF THE DISCLOSURE

Figure 1:
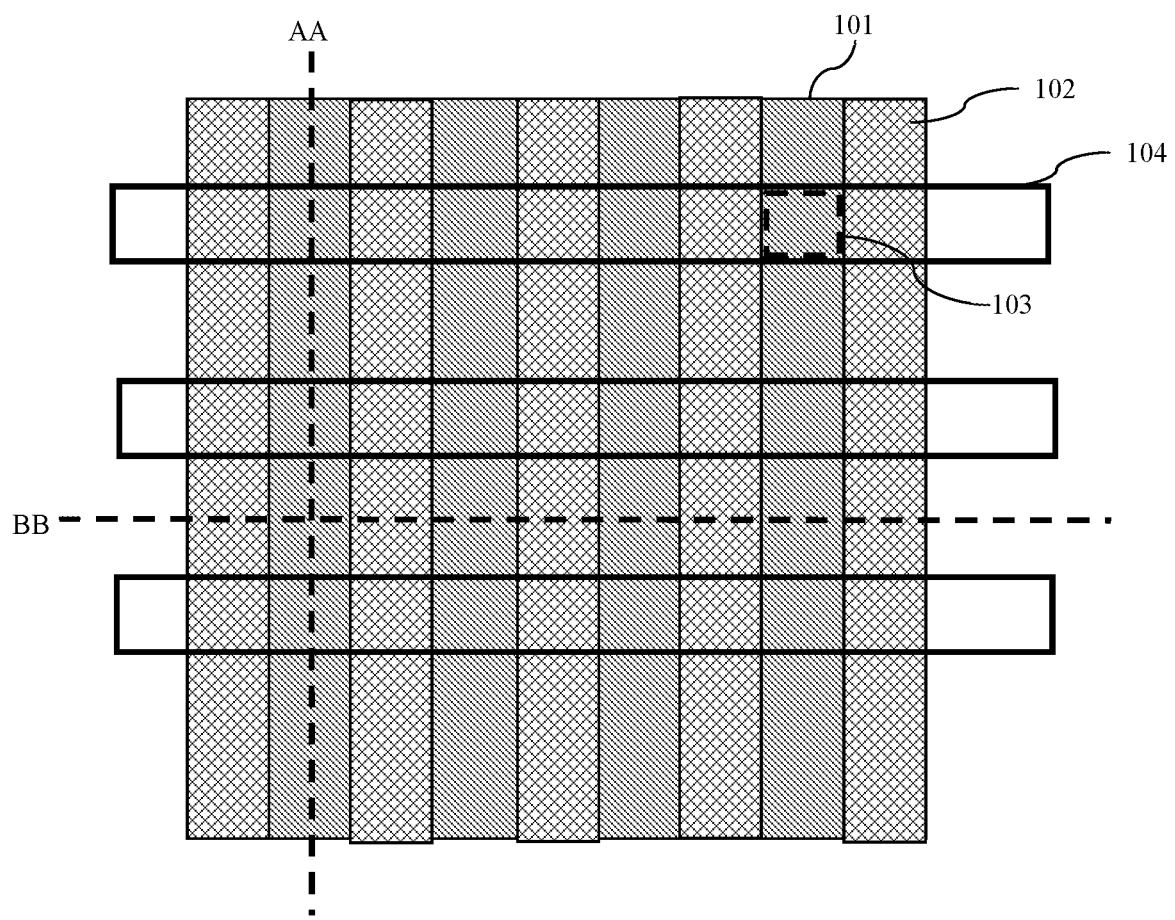
FIG. 1 is a plan view of a portion of a storage area in an existing method for manufacturing a gate of a NAND flash.
Figure 2A:
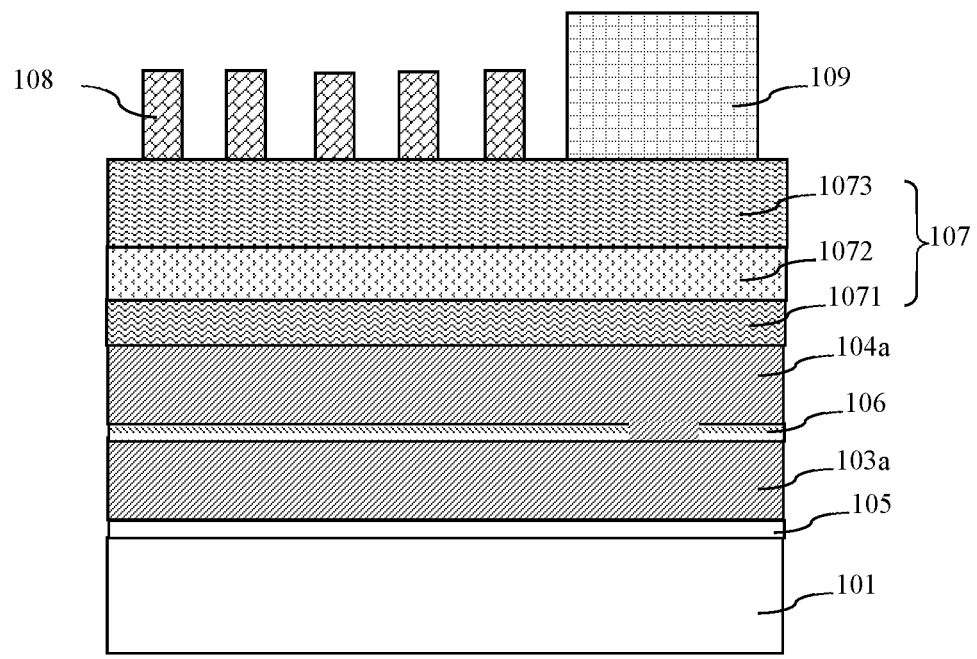
Figure 2B:
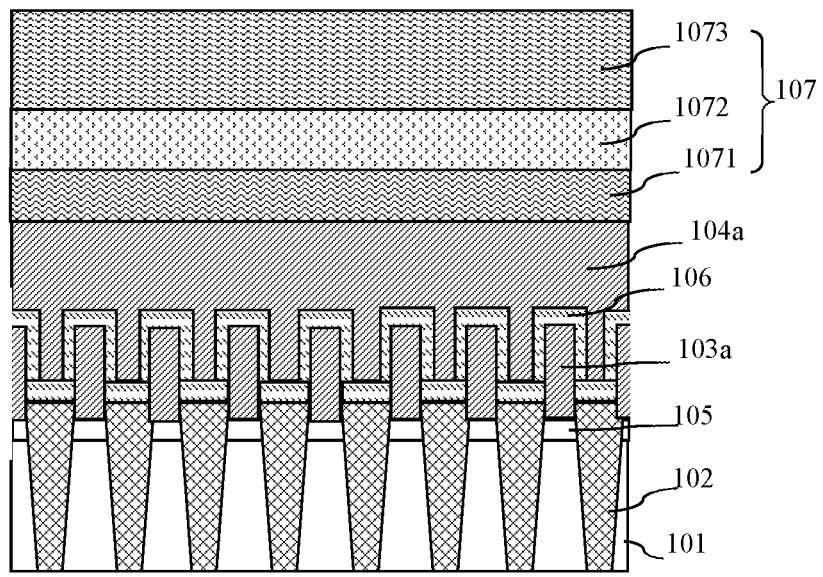
Figure 3A:
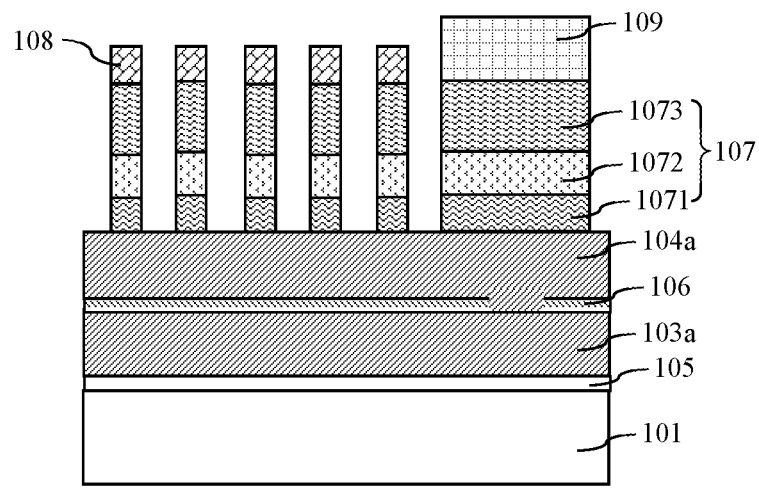
Figure 3B:
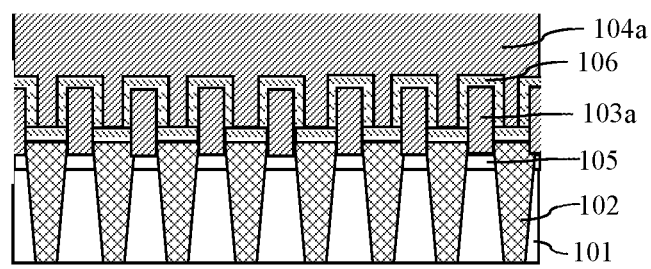
Figure 4A:
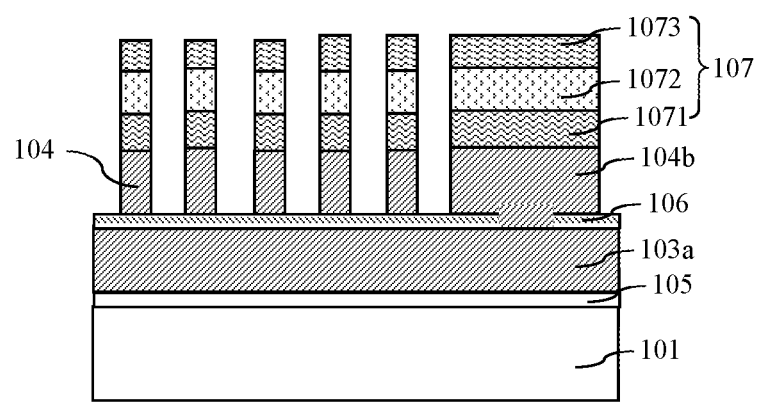
Figure 4B:
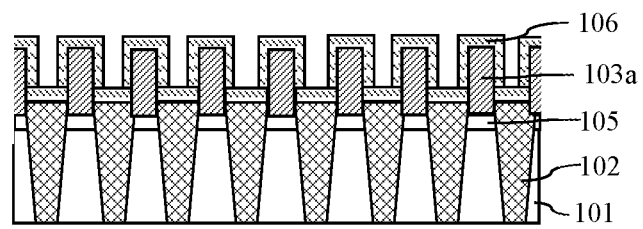
Figure 5A:
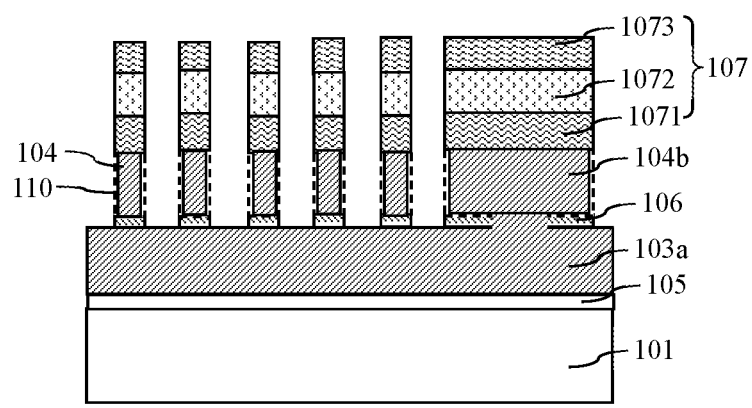
Figure 5B:
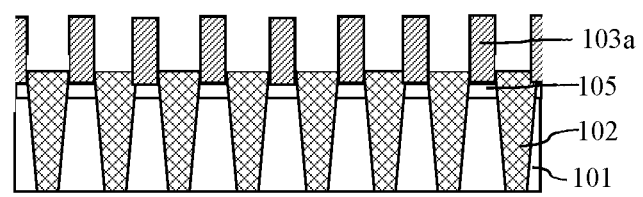
Figure 6A:
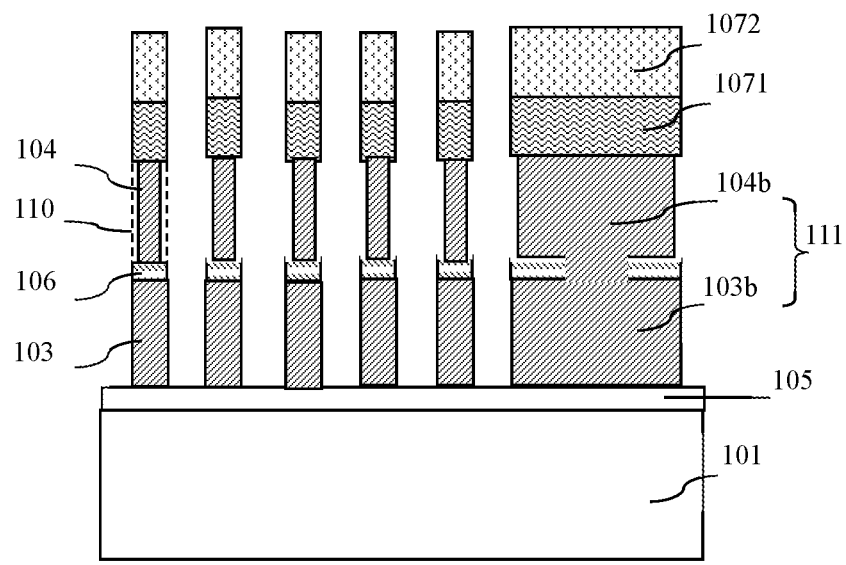
Figure 6B:
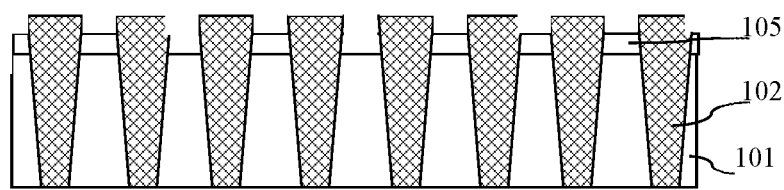
Figure 8:
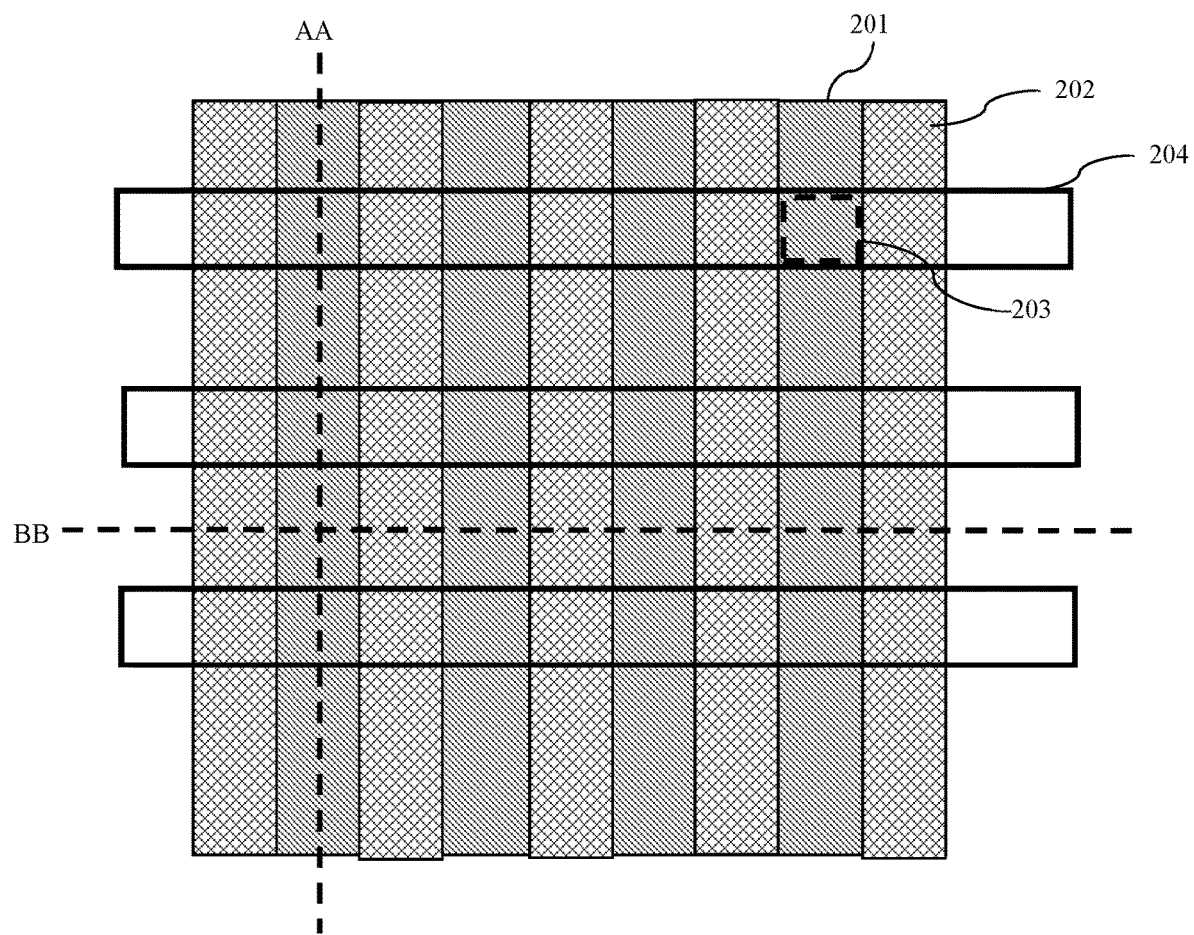
FIG. 8 is a plan view of a portion of a storage area in the method for manufacturing a gate of a NAND flash according to an embodiment of the present application.

FIG. 7 is a flowchart of a method for manufacturing a gate of a NAND flash according to the embodiment of the present application. FIG. 8 is a plan view of a portion of a storage area in the method for manufacturing a gate of a NAND flash according to the embodiment of the present application. FIGS. 9A-17A are sectional views along the dashed line AA in FIG. 8 in the steps of the method for manufacturing a gate of a NAND flash according to the embodiment of the present application. FIGS. 9B-17B are sectional views along the dashed line BB in FIG. 8 in the steps of the method for manufacturing a gate of a NAND flash according to the embodiment of the present application. In the method for manufacturing a NAND flash according to the embodiment of the present application, forming a memory cell of a storage area of the flash includes the following steps.

Step 1. Referring to FIG. 8, a plurality of field oxides 202 are formed on a semiconductor substrate 201, the field oxides 202 isolating a plurality of active areas. In FIG. 8, the semiconductor substrate 201 between the field oxides 202 forms the active area. A section at the dashed line AA is a section along the active area, and a section at the dashed line BB is a section between the subsequently formed polysilicon control gates 204. An overlap area of the polysilicon control gate 204 and the active area is a formation area of a polysilicon floating gate 203.

Figure 9A:
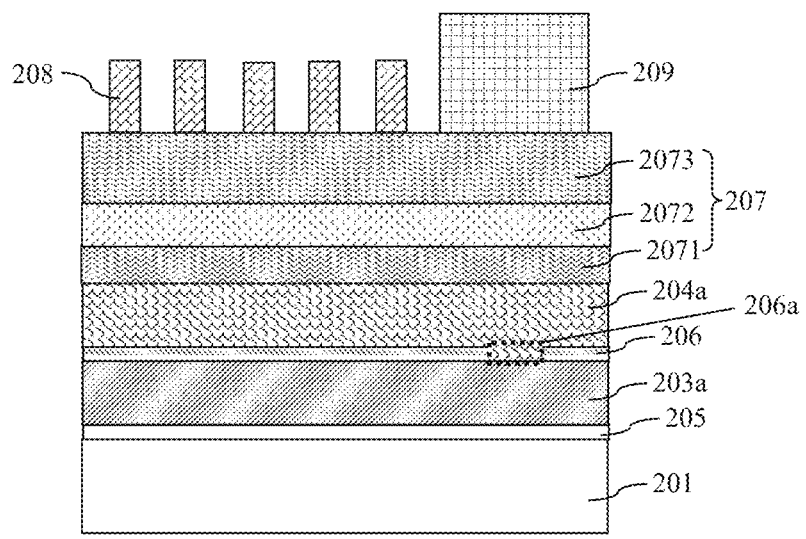

Referring to FIG. 9A, a floating gate dielectric layer 205 and a first polysilicon layer 203a are sequentially formed on the surface of the active area, and the first polysilicon layer 203a is used to form the polysilicon floating gate 203.

Figure 9B:
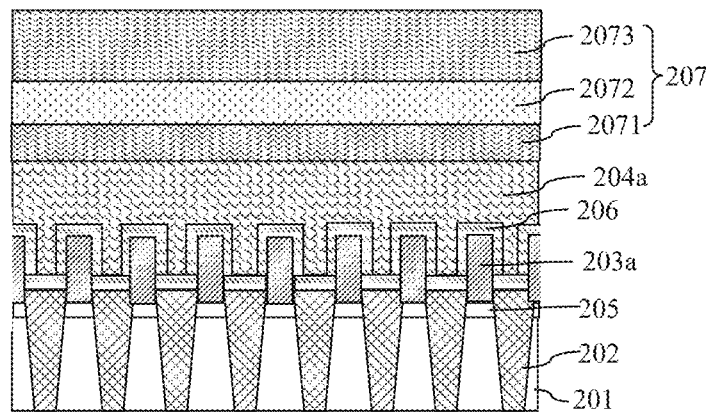

Referring to FIG. 9B, the floating gate dielectric layer 205 and the first polysilicon layer 203a are not formed on the surface of the field oxide 201. Referring to FIG. 8, the floating gate dielectric layer 205 and the first polysilicon layer 203a are generally formed on the surface of the active area in a self-aligned manner.

In this embodiment of the present application, the semiconductor substrate 201 includes a silicon substrate.

The field oxide 202 is formed by means of a shallow trench isolation process.

In some embodiments, in the storage area, all the field oxides 202 are arranged in parallel, and all the active areas are arranged in parallel.

Step 2. Referring to FIG. 9A, an inter-gate dielectric layer 206 and a second polysilicon layer 204a are sequentially formed. Referring to FIG. 9B, the inter-gate dielectric layer 206 covers the surface of the first polysilicon layer 203a and the surface of the field oxide 202; the second polysilicon layer 204a is formed on the surface of the inter-gate dielectric layer 206. The second polysilicon layer 204a is used to form the polysilicon control gate 204. The second polysilicon layer 204a has a first doping concentration, and the polysilicon control gate 204 has a target doping concentration. The first doping concentration is less than the target doping concentration, and the first doping concentration is configured such that the width of the polysilicon control gate 204 satisfies requirements after subsequent gate etching.

In this embodiment of the present application, a selection transistor is also formed in the storage area.

In an array of the memory cells, the selection transistor is connected in series with a plurality of the memory cells under control. After the inter-gate dielectric layer 206 is formed, the method further includes selectively etching the inter-gate dielectric layer 206 to remove the entire or part of the inter-gate dielectric layer 206 in a formation area of the selection transistor. Region 206a is the area where the inter-gate dielectric layer 206 has been removed. After the second polysilicon layer 204a is formed, in the formation area of the selection transistor, the bottom surface of the second polysilicon layer 204a is in contact with the top surface of the first polysilicon layer 203a at the location where the gate dielectric layer 206 is removed.

In some embodiments, a peripheral area (not shown) is provided outside the storage area, and a peripheral transistor is formed in the peripheral area. After the inter-gate dielectric layer 206 is formed, the method further includes selectively etching the inter-gate dielectric layer 206 to remove the entire or part of the inter-gate dielectric layer 206 in a formation area of the peripheral transistor. After the second polysilicon layer 204a is formed, in the formation area of the peripheral transistor, the second polysilicon layer 204a is in contact with the bottom first polysilicon layer 203a.

Step 3. Referring to FIG. 9A, a pattern transfer mask layer 207, which is composed of a plurality of mask sublayers with different etching rates, is formed on the surface of the second polysilicon layer 204a.

In this embodiment of the present application, the pattern transfer mask layer 207 is formed by stacking a first mask sublayer 2071, a second mask sublayer 2072, and a third mask sublayer 2073. The first mask sublayer 2071 is a silicon nitride layer, the second mask sublayer 2072 is a silicon oxide layer, and the third mask sublayer 2073 is made of amorphous silicon.

Step 4. Referring to FIG. 9A, a formation area of the polysilicon control gate 204 is defined. Since a formation area corresponding to FIG. 9B is an area between the polysilicon control gates 204, the area in FIG. 9B is fully open.

In this embodiment of the present application, a second spacer 208 is formed by means of an SADP process to define the formation area of the polysilicon control gate 204 of each of the memory cells.

A photoresist pattern 209 is used to define the formation areas of the polysilicon control gates 204 of each of the selection transistors and each of the peripheral transistors.

Figure 10A:
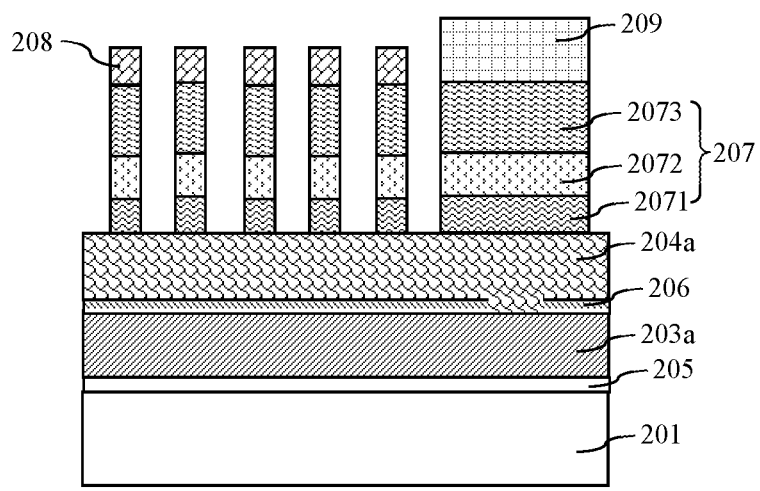

Referring to FIG. 10A, the mask sublayers of the pattern transfer mask layer 207 outside the formation area of the polysilicon control gate 204 are sequentially etched to achieve patterning of the pattern transfer mask layer 207. During patterned etching of the pattern transfer mask layer 207, the third mask sublayer 2073 is first etched by using the second spacer 208 and the photoresist pattern 209 as masks, so as to pattern the third mask sublayer 2073; then the second mask sublayer 2072 is etched by using the second spacer 208, the photoresist pattern 209, and the third mask sublayer 2073 at the bottom as masks, so as to pattern the second mask sublayer 2072; and after that, the first mask sublayer 2071 is etched by using the second spacer 208, the photoresist pattern 209, and the third mask sublayer 2073 and the second mask sublayer 2072 at the bottom as masks, so as to pattern the first mask sublayer 2071. By transferring a pattern downwards layer by layer, the pattern can be transferred accurately. In this way, even if a loss of the second spacer 208 and the photoresist pattern 209 occurs during an etching process, a pattern of the first mask sublayer 2071 is not affected.

Figure 10B:
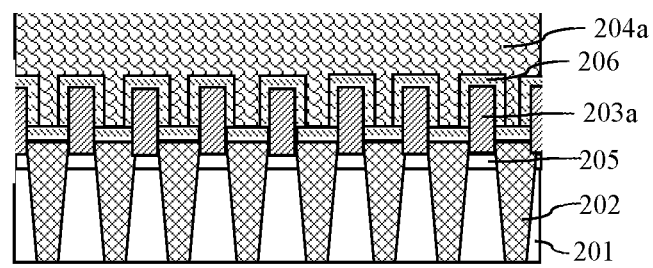

It can be seen from FIG. 10B that the pattern transfer mask layer 207 in FIG. 10B is fully removed.

Step 5. Gate etching is performed, including: sequentially etching the second polysilicon layer 204a, the inter-gate dielectric layer 206, and the first polysilicon layer 203a by using the patterned pattern transfer mask layer 207 as a mask.

That is, the gate etching includes three etching steps, which are respectively: etching of the second polysilicon layer 204a, etching of the inter-gate dielectric layer 206, and etching of the first polysilicon layer 203a.

Figure 11A:
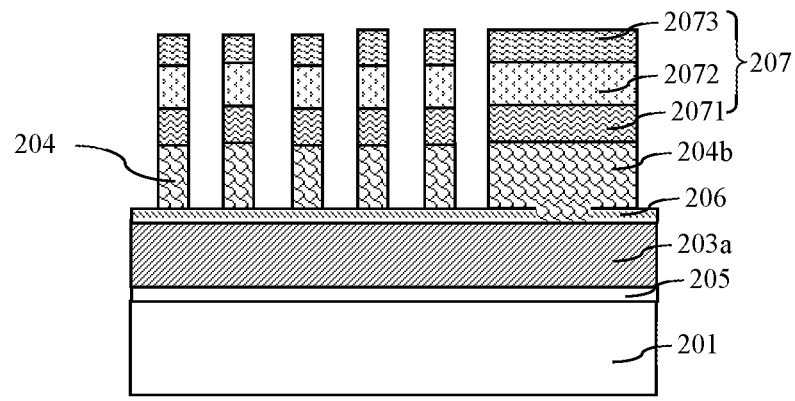
Figure 11B:
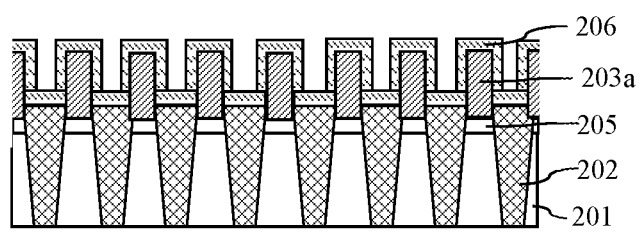

Referring to FIG. 11A, the polysilicon control gate 204 is formed by etching the second polysilicon layer 204a. In FIG. 11A, the polysilicon control gate formed after the etching of the second polysilicon layer 204a is separately represented by a mark 204. In addition, in the formation area of the selection transistor, an etched portion of the second polysilicon layer 204a is separately represented by a mark 204b. The second polysilicon layer 204a in an area shown in FIG. 11B is fully removed. The etching of the second polysilicon layer 204a stops on the surface of the inter-gate dielectric layer 206.

Figure 12A:
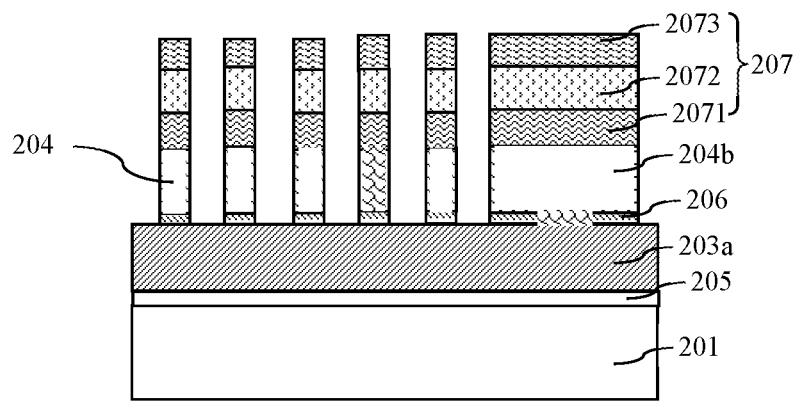
Figure 12B:
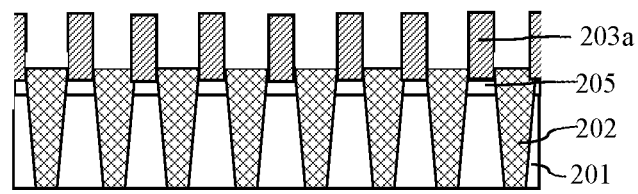

Referring to FIG. 12A, the etching of the inter-gate dielectric layer 206 is then performed, and the etching of the inter-gate dielectric layer 206 stops in the first polysilicon layer 203a. In this embodiment of the present application, during a process of etching the inter-gate dielectric layer 206, the side surface of the polysilicon control gate 204 is exposed and laterally etched to reduce the width of the polysilicon control gate 204. Due to a feature that a reduction in the width of the polysilicon control gate 204 is smaller when the first doping concentration is lower, the first doping concentration is pre-configured such the reduction in the width of the polysilicon control gate 204 is reduced after the etching of the inter-gate dielectric layer 206. The inter-gate dielectric layers 206 in an area shown in FIG. 12B is fully removed.

Figure 13A:
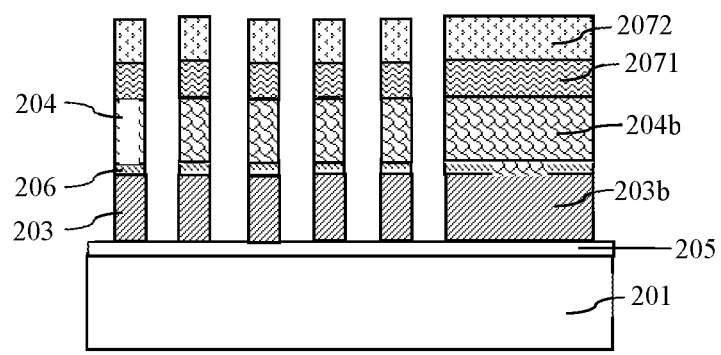
Figure 13B:
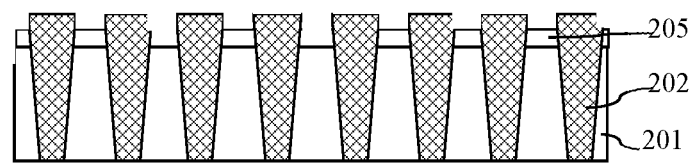

Referring to FIG. 13A, the etching of the first polysilicon layer 203a is then performed, and the etching of the first polysilicon layer 203a stops on the surface of the floating gate dielectric layer 205. In this embodiment of the present application, during a process of etching the first polysilicon layer 203a, the side surface of the polysilicon control gate 204 is exposed and laterally etched to reduce the width of the polysilicon control gate 204. Due to the feature that the reduction in the width of the polysilicon control gate 204 is smaller when the first doping concentration is lower, the first doping concentration is pre-configured such the reduction in the width of the polysilicon control gate 204 is reduced after the etching of the first polysilicon layer 203a. The first polysilicon layer 203a in an area shown in FIG. 13B is fully removed. In FIG. 13A, the polysilicon floating gate of the memory cell formed after the etching of the first polysilicon layer 203a is separately represented by a mark 203, and polysilicon of the selection transistor formed after the etching of the first polysilicon layer 203a is separately represented by a mark 203b.

In this embodiment of the present application, the first doping concentration is configured such that the width of the polysilicon control gate 204 satisfies the requirements after the gate etching is completed. The width of the polysilicon control gate 204 subjected to the gate etching is required to ensure that the polysilicon control gate 204 does not collapse and to satisfy electrical requirements of the device. Moreover, the overlap area between the polysilicon control gate 204 and the polysilicon floating gate 203 is increased. When the overlap area between the polysilicon control gate 204 and the polysilicon floating gate 203 is larger, the coupling between the polysilicon control gate 204 and the polysilicon floating gate 203 is stronger, thereby increasing a partial voltage applied to the floating gate dielectric layer 205 and increasing erasing and writing speeds of the device. Therefore, in this embodiment of the present application, the first doping concentration can be configured according to the performance requirements of the device such that the overlap area between the polysilicon control gate 204 and the polysilicon floating gate 203 satisfies the requirements.

The polysilicon control gate 204 is composed of the second polysilicon layer 204a subjected to the gate etching, and the polysilicon floating gate 203 is composed of the first polysilicon layer 203a subjected to the gate etching. Each of the memory cells has a first gate structure, and the first gate structure is formed by stacking the floating gate dielectric layer 205 formed on the surface of the active area, the polysilicon floating gate 203, the inter-gate dielectric layer 206, and the polysilicon control gate 204. A first interval area is provided between the first gate structures.

In some embodiments, referring to FIG. 8, all the memory cells are arranged in an array, the polysilicon control gates 204 of the memory cells in the same row are connected together to form a polysilicon row, each of the polysilicon rows spans a plurality of the active areas and a plurality of the field oxides 202, and all the polysilicon rows are arranged in parallel. In other embodiments, the array arrangement of the memory cells can be changed accordingly as needed.

In some embodiments, after the etching in step 5 is completed, a second gate structure of the selection transistor is also formed in the formation area of the selection transistor, and the second gate structure is formed by stacking the gate dielectric layer formed on the surface of the active area, the first polysilicon layer 203a, and the second polysilicon layer 204b. In FIG. 13A, the floating gate dielectric layer 205 is also used as the gate dielectric layer of the second gate structure.

In some embodiments, after the etching in step 5 is completed, a third gate structure (not shown) of the peripheral transistor is also formed in the formation area of the peripheral transistor, and the third gate structure is formed by stacking the gate dielectric layer formed on the surface of the active area, the first polysilicon layer, and the second polysilicon layer.

Figure 14A:
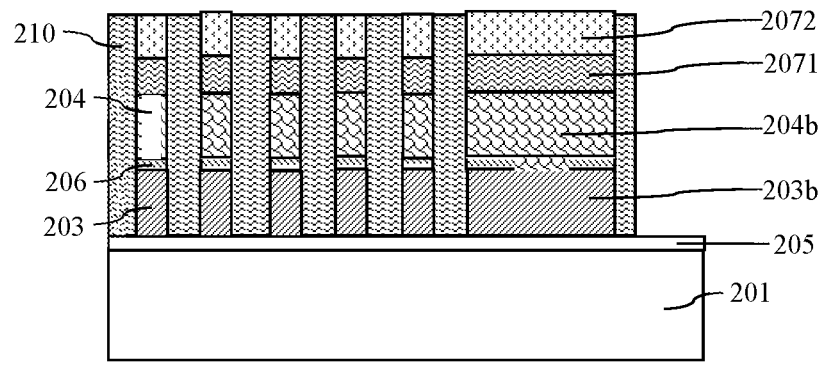

Step 6. Referring to FIG. 14A, a first spacer 210 is formed, wherein in the storage area, the first spacer 210 is formed on the side surface of the first gate structure and fully fills the first interval area.

Figure 14B:
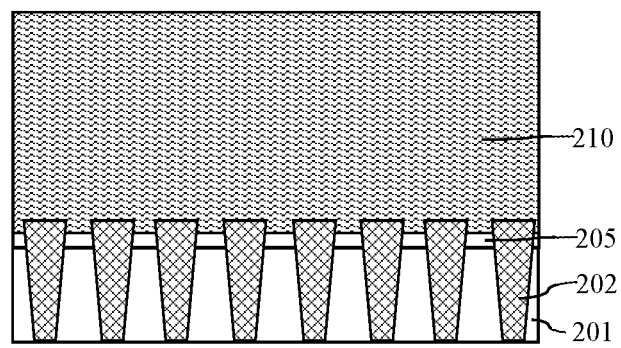

A sample shown in FIG. 14B is located in the first interval area, so the first spacer 210 in FIG. 14B is fully filled.

In some embodiments, in step 6, the first spacer 210 is also formed on the side surface of the second gate structure and the side surface of the third gate structure, in a second interval area between the second gate structures, and in a third interval area between the third gate structures. The second interval area is larger than the first interval area, and the third interval area is larger than the first interval area. The first spacer 210 does not fully fill the second interval area, and the first spacer 210 does not fully fill the third interval area.

In some embodiments, the first spacer 210 is formed by stacking a first sub-spacer and a second sub-spacer, the material of the first sub-spacer is silicon oxide, and the material of the second sub-spacer is silicon nitride. The second sub-spacer serves as a body portion, and the first sub-spacer serves as a liner layer.

Before subsequent step 7 is performed, the method further includes the following.

Figure 15A:
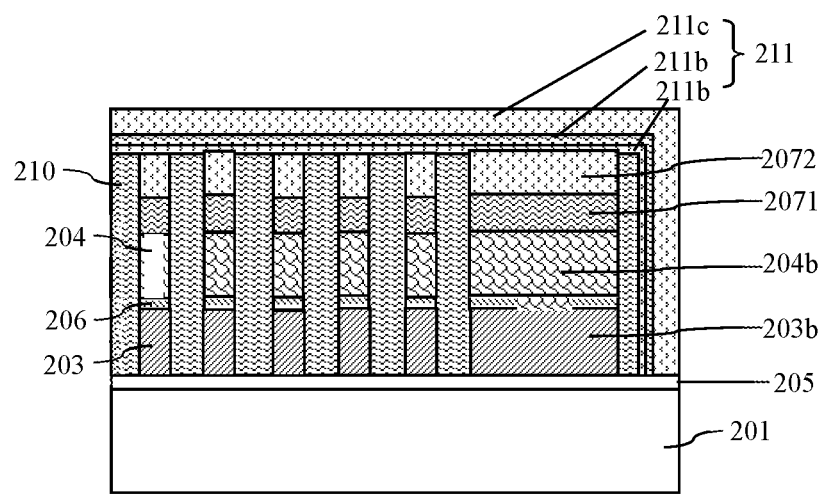
Figure 15B:
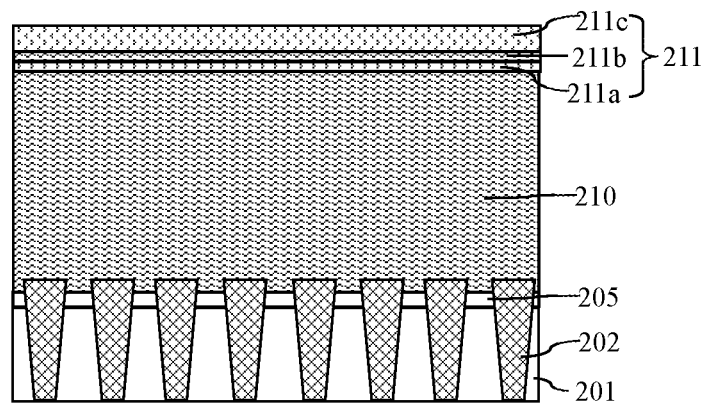

Referring to FIG. 15A, a second mask layer 211 is formed, the second mask layer 211 being formed on the top surfaces of the first gate structure, the second gate structure, and the third gate structure and on the surface of the active area in the second interval area and the third interval area. The second mask layer 211 is formed by stacking a silicon oxide layer 211a, a silicon nitride layer 211b, and a silicon oxide layer 211c, and the silicon oxide layer 211c serves as a body portion.

Figure 16A:
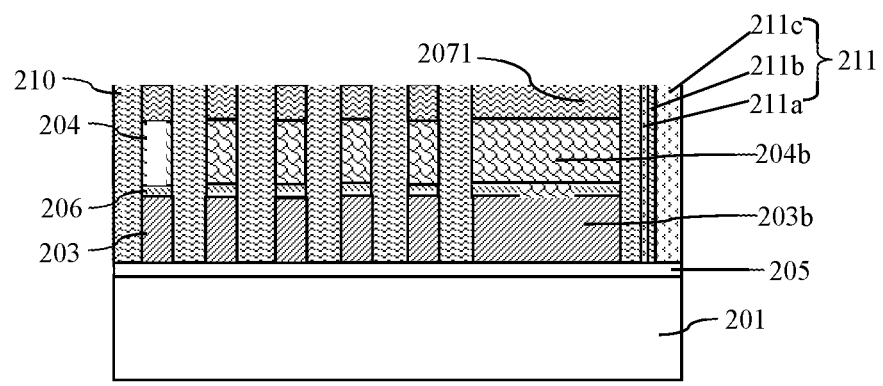
Figure 16B:
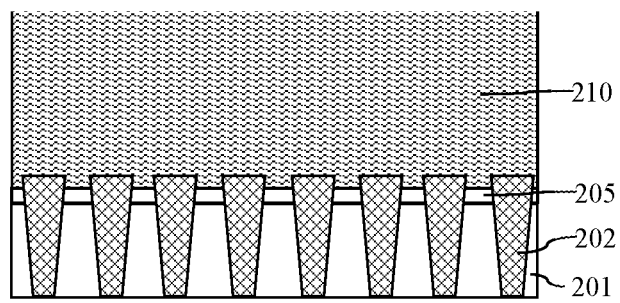

Referring to FIG. 16A, the second mask layer 211 is etched to remove the second mask layer 211 on the top surfaces of the first gate structure, the second gate structure, and the third gate structure, wherein the second interval area and the third interval area are filled with the first spacer 210 and the second mask layer 211. In FIG. 16B, the second mask layer 211 is fully removed.

Figure 17A:
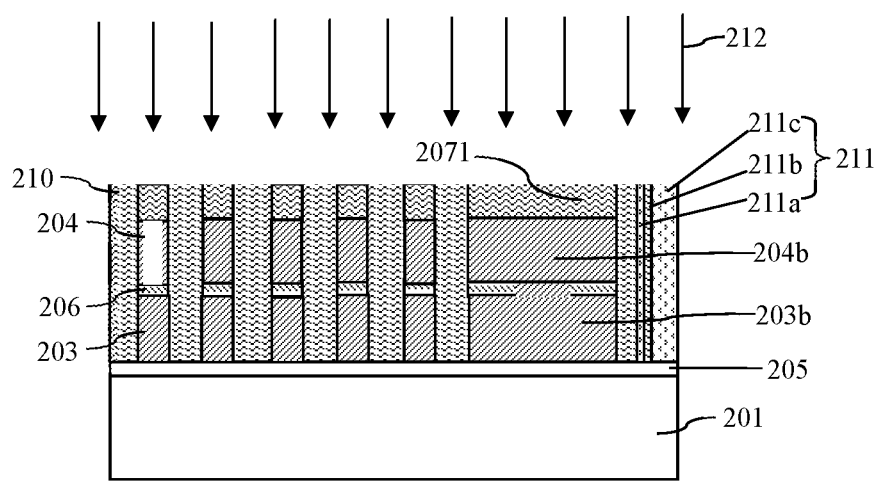
Figure 17B:
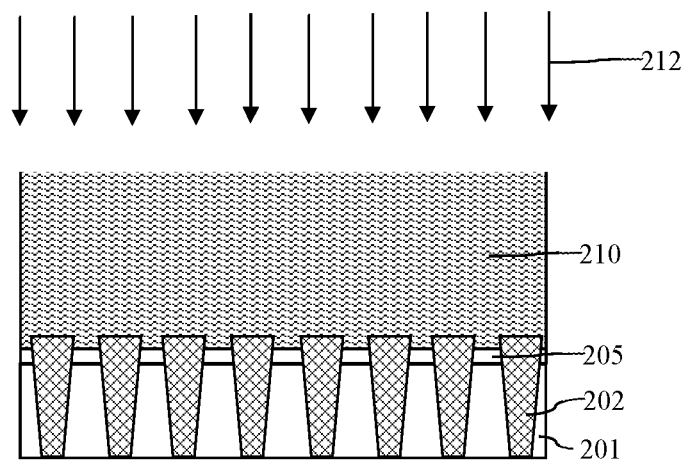

Step 7. Referring to FIG. 17A, the thickness of the pattern transfer mask layer 207 on the top of the polysilicon control gate 204 is adjusted by using the first spacer 210 as a self-aligned mask, and then self-aligned ion implantation 212 is performed, wherein due to the self-aligned ion implantation 212, a dopant is implanted into the polysilicon control gate 204 after passing through the pattern transfer mask layer 207, and the self-aligned ion implantation 212 increases a doping concentration of the polysilicon control gate 204 to the target doping concentration. The target doping concentration is configured such that a threshold voltage and erasing and writing speeds of the memory cell satisfy desired values. In can be seen from FIG. 17B that in an area between the polysilicon control gates 204, the self-aligned ion implantation 212 cannot be carried out in the active area, thus imposing no adverse impact on the performance of the device.

The second mask layer 211 is an air gap mask layer. After step 7 is completed, the method further includes the following.

The entire or part of the first spacer 210 is removed by using the second mask layer 211 as a mask.

The top of an area where the first spacer 210 is removed is closed, so as to form an air gap. The air gap can minimize parasitic capacitance of the device.

In this embodiment of the present application, the first doping concentration of the second polysilicon layer 204a used to form the polysilicon control gate 204 by means of etching is configured to be less than the target doping concentration of the polysilicon gate. In this case, the first doping concentration can be configured independently of the target doping concentration, so that the first doping concentration can be configured according to the gate etching process requirements of the memory cell. Due to the feature that the reduction in the width of the polysilicon control gate 204 is smaller when the first doping concentration is lower in the processes of etching the inter-gate dielectric layer 206 and the first polysilicon layer 203a, the reduction in the width of the polysilicon control gate 204 in the etching process is reduced by reducing the first doping concentration, thereby increasing the width of the etched polysilicon control gate 204, so that the width of the etched polysilicon control gate 204 satisfies the requirements. The width of the etched polysilicon control gate 204 is required to ensure that the polysilicon control gate 204 does not collapse and to satisfy electrical requirements. On the basis that the polysilicon gate does not collapse, after the width of the etched polysilicon control gate 204 is increased, the overlap area between the polysilicon control gate 204 and the polysilicon floating gate 203 is also increased, thereby improving the coupling between the polysilicon control gate 204 and the polysilicon floating gate 203. Therefore, this embodiment of the present application eventually can increase the gate etching process window and device window of the memory cell and improve the device performance.

Moreover, in this embodiment of the present application, after the etching process of the first gate structure is completed, by filling the first interval area between the first gate structures with the first spacer 210, the self-aligned ion implantation 212 on the polysilicon control gate 204 can be realized, the doping concentration of the polysilicon control gate 204 is increased to the target doping concentration by means of the self-aligned ion implantation 212, and the self-aligned ion implantation can reduce the process cost. The target doping concentration can enable the performance of the memory cell such as the threshold voltage and erasing and writing speeds to satisfy the requirements. When the target doping concentration is higher, the thickness of the polysilicon depletion layer of the polysilicon control gate 204 is smaller, the polysilicon resistance of the polysilicon control gate 204 is smaller, the capacitance between the polysilicon control gate 204 and the polysilicon floating gate 203 is larger, and the coupling effect is stronger, thereby increasing the erasing and writing speeds. In this way, the erasing and writing speeds can satisfy the requirements.

As can be seen from the above, in this embodiment of the present application, the doping concentrations of the second polysilicon layer 204a subjected and not subjected to the etching are configured according to different requirements, respectively, so as to solve the defect that the etching process window for the first gate structure and the performance of the product device have contradictory requirements for the doping concentration of the second polysilicon layer 204a, so that the etching process window for the first gate structure and the performance of the eventually formed product device can both satisfy the requirements, respectively.

In addition, the self-aligned ion implantation 212 of this embodiment of the present application does not require an additional mask, so this embodiment of the present application also has a feature of a low process cost.

In this embodiment of the present application, due to the advantage that a film outside the gate structure is fully exposed in an original air gap process, low-doped polysilicon is adopted during formation of the polysilicon control gate, thereby increasing the gate etching process window. Then, a self-aligned doping process is performed on the polysilicon control gate in the subsequent process, thereby increasing the performance of the product device. In this way, not only the requirements of the etching process but also the requirements of the product device are met.

In the existing process for manufacturing an advanced-node NAND flash, an in-situ doping process is adopted to form a polysilicon control gate. In order to meet the requirements of the product device, it is necessary to adopt a polysilicon control gate doped with phosphorus of a relatively high concentration. However, such polysilicon of a relatively high doping concentration is unfriendly to the subsequent gate etching process. After the entire etching process, a dimension reduction phenomenon occurs in the polysilicon control gate, which leads to a gate structure collapse phenomenon in the subsequent process, thus affecting the product yield, in particular at a more advanced NAND flash node. After experiments, it is found that reducing the phosphorus doping concentration has significant effect on improving the gate structure morphology, but is unfriendly to the performance of the product device, affecting key parameters of the control gate, such as the programming speed. In order to solve the above problem, a higher phosphorus doping concentration is required. The above two requirements restrict each other, thus bringing a great challenge to the entire production process. In the process proposed in this embodiment of the present application, the low-doped polysilicon is adopted during the formation of the polysilicon control gate, thereby increasing the process window of the subsequent gate etching process. After the gate is formed, taking full advantage of the feature that the polysilicon of the gate structure is exposed in the air gap process section, self-aligned ion implantation is performed to dope the polysilicon, so as to satisfy the requirements of the product device.

The present application is described in detail above by using specific embodiments, which, however, are not intended to limit the present application. Without departing from the principles of the present application, those skilled in the art can also make many modifications and improvements, which should also be regarded as the scope of protection of the present application.

What is claimed is:

1. A method for manufacturing a NAND flash, wherein a storage area of the flash includes multiple memory cells, and the formation of each memory cell includes the following steps:

step 1, forming a plurality of field oxides on a semiconductor substrate, the field oxides isolating a plurality of active areas, and sequentially form a floating gate dielectric layer and a first polysilicon layer on the surface of an active area, the first polysilicon layer being used to form a polysilicon floating gate;

step 2, sequentially forming an inter-gate dielectric layer and a second polysilicon layer, the inter-gate dielectric layer covering the surface of the first polysilicon layer and the surface of the field oxide, the second polysilicon layer being formed on the surface of the inter-gate dielectric layer, the second polysilicon layer being used to form a polysilicon control gate, the second polysilicon layer having a first doping concentration, the polysilicon control gate having a target doping concentration, the first doping concentration being less than the target doping concentration, and the first doping concentration is used to control the lateral etching of the polycrystalline silicon control gate in subsequent gate etching;

step 3, forming a pattern transfer mask layer composed of a plurality of mask sublayers with different etching rates on the surface of the second polysilicon layer;

step 4, defining a formation area of the polysilicon control gate, and sequentially etching the mask sublayers of the pattern transfer mask layer outside the formation area of the polysilicon control gate to achieve patterning of the pattern transfer mask layer;

step 5, performing gate etching, comprising: sequentially etching the second polysilicon layer, the inter-gate dielectric layer, and the first polysilicon layer by using the patterned pattern transfer mask layer as a mask, wherein the polysilicon control gate is composed of the second polysilicon layer subjected to the gate etching, the polysilicon floating gate is composed of the first polysilicon layer subjected to the gate etching, each of the memory cells has a first gate structure, the first gate structure is formed by stacking the floating gate dielectric layer formed on the surface of the active area, the polysilicon floating gate, the inter-gate dielectric layer, and the polysilicon control gate, and a first interval area is provided between the first gate structures;

during processes of etching the inter-gate dielectric layer and the first polysilicon layer, the side surface of the polysilicon control gate is exposed and laterally etched to reduce the width of the polysilicon control gate, the first doping concentration controls the lateral etching amount of the polysilicon control gate;

step 6, forming a first spacer, wherein in the storage area, the first spacer is formed on the side surface of the first gate structure and fully fills the first interval area; and step 7, adjusting a thickness of the pattern transfer mask layer on the top of the polysilicon control gate by using the first spacer as a self-aligned mask, and then performing self-aligned ion implantation, wherein due to the self-aligned ion implantation, a dopant is implanted into the polysilicon control gate after passing through the pattern transfer mask layer, and the self-aligned ion implantation increases a doping concentration of the polysilicon control gate to the target doping concentration.

2. The method for manufacturing a NAND flash according to claim 1, wherein the semiconductor substrate comprises a silicon substrate.

3. The method for manufacturing a NAND flash according to claim 2, wherein the field oxide is formed by means of a shallow trench isolation process.

4. The method for manufacturing a NAND flash according to claim 1, wherein in step 1, in the storage area, all the field oxides are arranged in parallel, and all the active areas are arranged in parallel.

5. The method for manufacturing a NAND flash according to claim 4, wherein in step 5, all the memory cells are arranged in an array, the polysilicon control gates of the memory cells in the same row are connected together to form a polysilicon row, each of the polysilicon rows spans a plurality of the active areas and a plurality of the field oxides, and all the polysilicon rows are arranged in parallel.

6. The method for manufacturing a NAND flash according to claim 5, wherein multiple selection transistors are also formed in the storage area;

in an array of the memory cells, each selection transistor is connected in series with a plurality of the memory cells;

after the inter-gate dielectric layer is formed in step 2, the method further comprises selectively etching the inter-gate dielectric layer to remove the entire or part of the inter-gate dielectric layer in a formation area of each selection transistor; after the second polysilicon layer is formed, in the formation area of each selection transistor, the bottom surface of the second polysilicon layer is in contact with the top surface of the first polysilicon layer at the location where the gate dielectric layer is removed; and after the etching in step 5 is completed, a second gate structure of the selection transistor is also formed in the formation area of the selection transistor, and the second gate structure is formed by stacking the gate dielectric layer formed on the surface of the active area, the first polysilicon layer, and the second polysilicon layer.

7. The method for manufacturing a NAND flash according to claim 6, wherein a peripheral area is provided outside the storage area, and multiple peripheral transistors are formed in the peripheral area;

after the inter-gate dielectric layer is formed in step 2, the method further comprises selectively etching the inter-gate dielectric layer to remove the entire or part of the inter-gate dielectric layer in a formation area of each peripheral transistor; after the second polysilicon layer is formed, in the formation area of each peripheral transistor, the bottom surface of the second polysilicon layer is in contact with the top surface of the first polysilicon layer at the location where the gate dielectric layer is removed; and after the etching in step 5 is completed, a third gate structure of each peripheral transistor is also formed in the formation area of each peripheral transistor, and the third gate structure is formed by stacking the gate dielectric layer formed on the surface of the active area, the first polysilicon layer, and the second polysilicon layer.

8. The method for manufacturing a NAND flash according to claim 1, wherein in step 3, the pattern transfer mask layer is formed by stacking a first mask sublayer, a second mask sublayer, and a third mask sublayer, the first mask sublayer is a silicon nitride layer, the second mask sublayer is a silicon oxide layer, and the third mask sublayer is made of amorphous silicon.

9. The method for manufacturing a NAND flash according to claim 7, wherein in step 4, a second spacer is formed by means of an SADP process to define the formation area of the polysilicon control gate of each of the memory cells; and a photoresist pattern is used to define the formation areas of the polysilicon control gates of each of the selection transistors and each of the peripheral transistors.

10. The method for manufacturing a NAND flash according to claim 7, wherein in step 6, the first spacer is also formed on the side surface of the second gate structure and the side surface of the third gate structure, in a second interval area between the second gate structures, and in a third interval area between the third gate structures.

11. The method for manufacturing a NAND flash according to claim 10, before step 7, further comprising:

forming a second mask layer, the second mask layer being formed on the top surfaces of the first gate structure, the second gate structure, and the third gate structure and on the surface of the active area in the second interval area and the third interval area; and etching the second mask layer to remove the second mask layer on the top surfaces of the first gate structure, the second gate structure, and the third gate structure, wherein the second interval area and the third interval area are filled with the first spacer and the second mask layer.

12. The method for manufacturing a NAND flash according to claim 11, wherein the second mask layer is an air gap mask layer, and after step 7 is completed, the method further comprises:

removing the entire or part of the first spacer by using the second mask layer as a mask; and closing the top of an area where the first spacer is removed, so as to form an air gap.

13. The method for manufacturing a NAND flash according to claim 12, wherein the first spacer is formed by stacking a first sub-spacer and a second sub-spacer, the material of the first sub-spacer is silicon oxide, and the material of the second sub-spacer is silicon nitride.

14. The method for manufacturing a NAND flash according to claim 13, wherein the second mask layer is formed by stacking a silicon oxide layer, a silicon nitride layer, and a silicon oxide layer.

15. The method for manufacturing a NAND flash according to claim 1, wherein the target doping concentration is configured such that a threshold voltage and erasing and writing speeds of the memory cell satisfy desired values.

* * * * *